(12) United States Patent
Kalani et al.

(10) Patent No.: US 11,758,684 B1
(45) Date of Patent: Sep. 12, 2023

(54) POWER SUPPLY FAN SPEED ALGORITHM TO PREVENT AIR RE-CIRCULATION

(71) Applicant: ZT Group Int'l, Inc., Secaucus, NJ (US)

(72) Inventors: Ankit Kalani, Secaucus, NJ (US); Ting Yu Lin, Secaucus, NJ (US); Mark D. Chubb, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 135 days.

(21) Appl. No.: 16/900,143

(22) Filed: Jun. 12, 2020

(51) Int. Cl.
*H05K 7/20* (2006.01)
*G06F 1/20* (2006.01)

(52) U.S. Cl.
CPC ............ *H05K 7/20145* (2013.01); *G06F 1/20* (2013.01); *H05K 7/20209* (2013.01)

(58) Field of Classification Search
CPC ... H05K 7/20145; G06F 1/20; H05K 7/20209; G06F 1/206; H05K 7/20136
USPC ....... 361/695, 679.48, 679.49, 690, 678, 688, 361/719, 692; 165/104.33, 287, 299, 97; 700/299, 300
See application file for complete search history.

(56) References Cited

U.S. PATENT DOCUMENTS

| | | | | |
|---|---|---|---|---|
| 6,108,203 A * | 8/2000 | Dittus et al. | ............ | F04D 25/14 236/49.5 |
| 6,587,340 B2 * | 7/2003 | Grouell et al. | ....... | H05K 7/2019 165/122 |
| 7,535,709 B2 * | 5/2009 | Fan et al. | ................ | G06F 1/20 174/16.3 |
| 9,326,419 B2 * | 4/2016 | Chen et al. | ........ | H05K 7/20145 |
| 10,495,096 B2 * | 12/2019 | Chen et al. | ......... | F04D 25/0693 |
| 11,129,296 B2 * | 9/2021 | Chen et al. | ........ | H05K 7/20727 |
| 2020/0204452 A1 * | 6/2020 | Bhat et al. | ......... | H04L 41/0677 |
| 2021/0100137 A1 * | 4/2021 | Harrington | ........ | H05K 7/20781 |
| 2021/0176900 A1 * | 6/2021 | Zhu et al. | .......... | H05K 7/20927 |
| 2021/0204452 A1 * | 7/2021 | Kazi et al. | .......... | H05K 7/20836 |
| 2022/0142008 A1 * | 5/2022 | Patel | ................ | H05K 7/20172 361/679.48 |

* cited by examiner

*Primary Examiner* — Mandeep S Buttar
(74) *Attorney, Agent, or Firm* — Dergosits & Noah LLP; Todd A. Noah

(57) ABSTRACT

A method and system improve the cooling of computer power supply unit by eliminating a reverse flow of hot air caused by an imbalance in airflow between a power supply fan and a system fan. The method determines a correlation between a system fan speed and a heightened power supply fan speed that prevents the reverse flow of hot air into the power supply unit. During the operation of the power supply unit, the system fan speed is obtained and the heightened power supply fan speed is determined from the correlation. The power supply fan is then controlled using the heightened power supply fan speed setting.

20 Claims, 6 Drawing Sheets

POWER SUPPLY FAN SPEED ALGORITHM TO PREVENT AIR RE-CIRCULATION

BACKGROUND

Unwanted power supply unit (PSU) air recirculation may occur when the system fan airflow is significantly greater than the airflow of the PSU. System fan airflow may be increased without corresponding changes to PSU fan airflow because, generally, the control of the system fan speed is separate from the fan speed control (FSC) of the PSU fans. A high pressure gradient created by the system fan exhaust airflow being larger than the PSU airflow may overpower the PSU airflow and lead to air flowing in the reverse direction, pulling heat from the hot aisle back into the PSU. The imbalance between system fan airflow and PSU airflow may be caused when the system fans are ramped up to compensate for increasing system component temperatures and loading while at the same time the PSU fan speeds remain at independent levels set by the PSU FSC.

The reverse flow of PSU exhaust air may result in increased PSU operating temperatures that are detrimental to both the efficient operation and longevity of the PSU.

Such reverse PSU air flow may be addressed using hardware changes. However, hardware changes are often undesirable or impractical. For example, PSU air recirculation may be avoided by using stronger fans inside the PSU. However, this requires PSU vendors to change fans. Such changes may cause delays (e.g., due to required quality tests and supply-chain changes), may require customer approval, and may result in general push back from PSU vendors. PSU air recirculation may also be avoided by other hardware changes, e.g., additional foam within the PSU, and changes to chassis to provide better sealing. Depending on the product cycle phase, this might not be an option. And there is a limit to how much sealing that can be provided - a perfect PSU chassis seal is not feasible. And PSU air recirculation may also be avoided by using an additional PSU-specific fan in the server. However, this introduces new complications, such as, fan failure requirements that must be tested and met, the board change that may be required by the addition of a separate PSU fan speed signal in the server fan controller, issues related to new cable routings, and the question of where to locate the additional fan within the server.

Thus, what is needed is a system and method that optimizes the airflow of the PSU fans in comparison to the airflow of the system fans to prevent the reverse flow from the hot aisle of the Data Center through the PSU and into the System.

BRIEF DESCRIPTION OF THE DRAWINGS

The embodiments are illustrated by way of example and not limitation in the accompanying drawings, in which like references indicate similar elements, and in which.

DETAILED DESCRIPTION

The subject matter discloses embodiments of a method for preventing power supply air-recirculation using a PSU fan speed algorithm. In embodiments, the PSU fan speed is controlled so that the PSU fan speed is increased to compensate for increased system fan speed thereby balancing PSU and system outlet pressures. In embodiments, the control of the PSU fan speed prevents the occurrence of significant pressure gradients between the PSU fan zone and general system fan zone. Thus, embodiments, by increasing the PSU airflow with respect to system airflow, may prevent hot aisle exhaust air recirculation through the PSU and provide extended PSU operating life and efficiency. In an embodiment, PSU fans may be boosted above the fan speed setting of their native PSU FSC. In an embodiment, a relationship between a desired PSU fan speed and the system fan speed may be established that adjusts PSU fan speed to avoid recirculation at all operating conditions. In an embodiment the desired PSU fan speed that avoids recirculation is typically greater than the PSU fan speed setting of the native PSU FSC. In an embodiment, the relationship between the desired PSU fan speed and the system fan speed may be incorporated into the System's baseboard management controller (BMC) firmware (FW). The BMC FW can be written to allow the PSU to run its native FSC while the System Fan Speed is below a certain threshold. This threshold represents the point when the system may be exposed to a pressure imbalance between the PSU and System Fan Zones. Once the System Fan Speed exceeds this threshold, the BMC FW can override the PSU Fan PWM control through PMBus (Power Management Bus) register access and override the PSU Fan Speed accordingly to rebalance the pressure differential. The BMC Fan "boost" control can co-exist with the PSU's native FSC because it runs the Fan Speeds higher than what the PSU requires to keep its internal components cool. When the System Fan Speed drops back below the threshold and there is no risk of pressure imbalance between the PSU and System Fan Zones, the BMC FW will relinquish control of the PSU Fan PWM.

Figure 1:
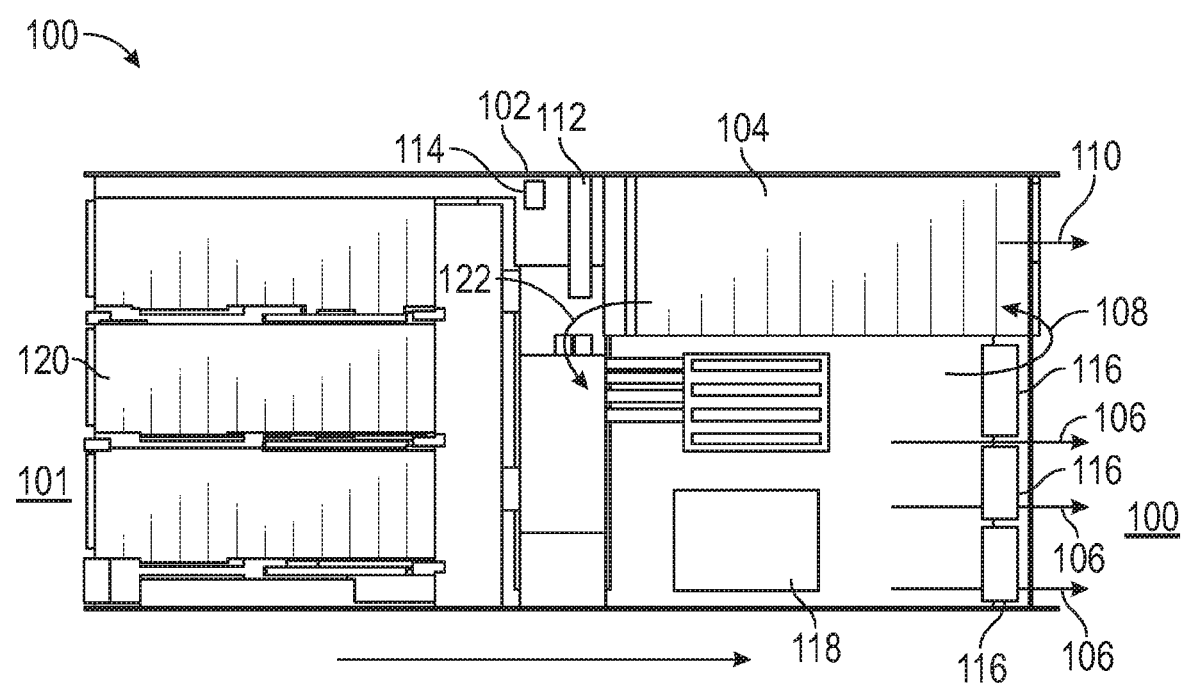
FIG. 1 is a schematic diagram illustrating the flow path of hot air being drawn back into a PSU.

FIG. 1 is a schematic diagram illustrating the flow path of hot air being drawn back into a PSU. In FIG. 1, a server 102 positioned between a hot aisle 100 and a cold aisle 101. Server 102 includes a PSU bundle 104 and heat-producing devices 120, e.g., field-programmable gate array (FPGA). PSU bundle 104 may include multiple individual PSUs (e.g., see PSU 202, PSU 204, PSU 206 (FIG. 2)). Heat-producing devices 120 are cooled by system fans 116 creating an airflow that draws air from cold aisle 101, through server 102, and expels system hot air 106 into hot aisle 100. System fans 116 are controlled by a system fan controller 118, e.g., a baseboard management controller (BMC). Each PSU of PSU bundle 104 is cooled by a PSU fan 112. Each PSU fan 112 is controlled by a PSU fan speed controller (FSC) 114. PSU fan 112 pushes air through a PSU of PSU bundle 104 creating an ideal PSU exhaust airflow 110 into hot aisle 100. Note that although PSU bundle 104 is a subsystem of server 102, for this discussion the exhaust of PSU bundle 104 is considered separately from the rest of the exhaust (i.e., exhaust air 106) of server 102.

At some point, system airflow 106 may be increased with respect to PSU airflow 110 to the extent that hot aisle air pushes into the PSU in a reverse direction 108 to the intended PSU airflow direction. This hot aisle reverse PSU airflow 108 is undesirable because it reduces the cooling of one or more PSUs of PSU bundle 104, which may raise the operating temperature of the affected PSU to the point that efficiency and longevity are reduced. Because native FSC control of PSU fan 112 may be balanced to conserve energy and not over-cool the PSU, ideal PSU airflow 110 may be just enough to keep the operating temperature of the PSU within a desired range of its specified operating conditions. Thus partial reverse PSU airflow 108 can still have negative effects on the longevity and efficiency of the affected PSU. Reverse PSU airflow 108 may be accompanied by an interior system recirculating airflow 122. The exact location of the path of recirculating airflow 122 may not be known as such flow would be complicated. However, it is anticipated that recirculating airflow 122 is facilitated by holes in a PSU associated with, e.g., power connections and other wiring. The recirculation shown by the combination of reverse PSU airflow 108 and recirculating airflow 122 reduces the cooling of the affected PSU and also returns exhaust air to the interior of server 102. Thus, reverse airflow 108, by causing recirculating airflow 122, may negatively impact the cooling of server 102.

Figure 2:
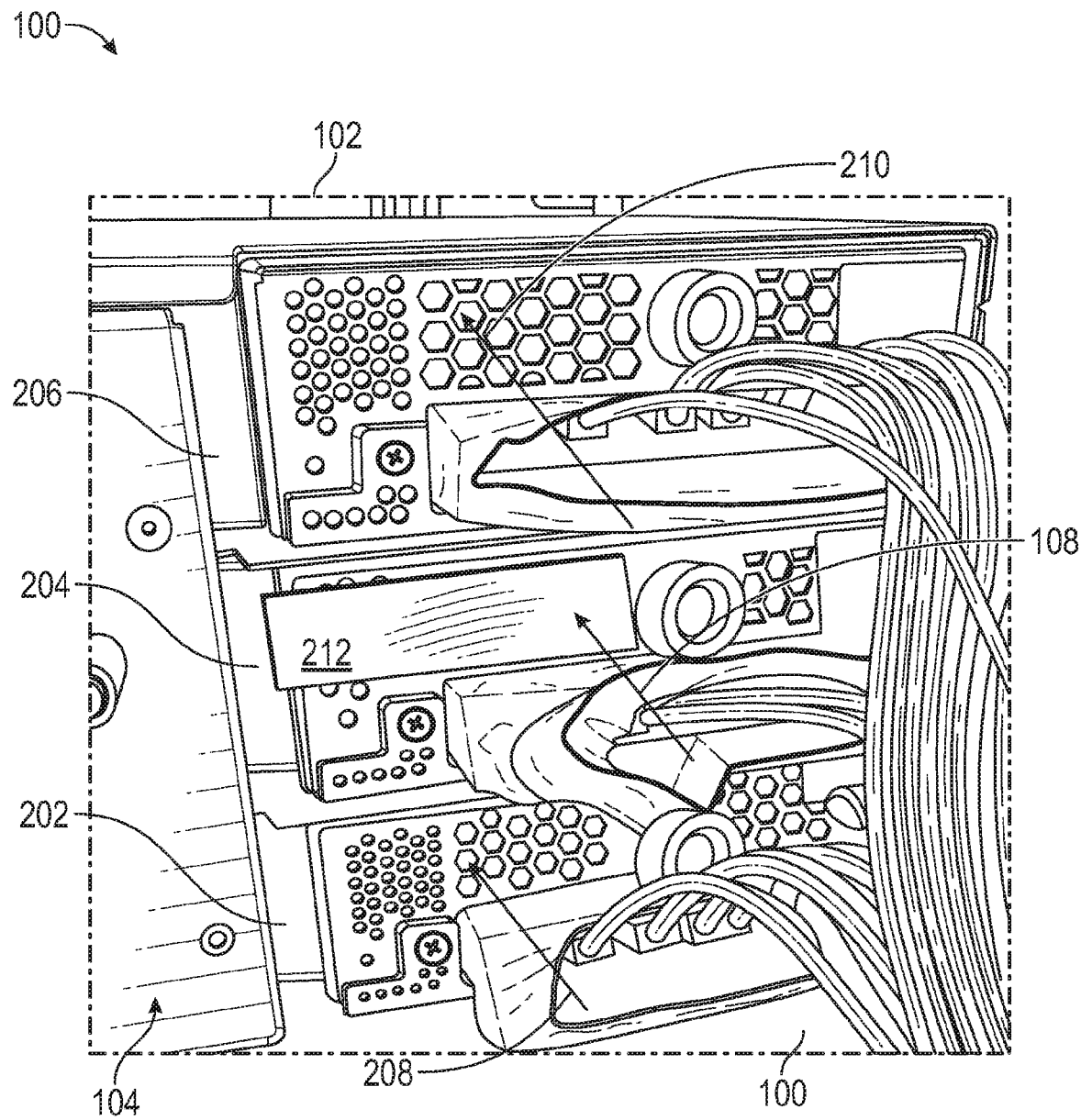
FIG. 2 is an image showing hot air being drawn back into a PSU.

FIG. 2 is an image showing hot air being drawn back into a PSU. In FIG. 2, PSU bundle 104 is shown to include separate PSUs 202, 204, 206. PSU 204 has been arbitrarily chosen as having the reverse airflow 108 discussed with regard to FIG. 1. PSU 202, 206 are shown to have reverse airflows 208, 210, respectively. By way of illustrating reverse airflow 108, a telltale 212 (a piece of paper) is placed against the exhaust port of PSU 204. Telltale 212 is held in place by the force of reverse PSU airflow 108, which confirms that air from the hot aisle 100 is flowing into PSU 204, rather than out of PSU 204.

FIG. 2 shows recirculation with air being pulled into PSU 204 instead of being pushed out. This can severely affect the performance of PSU 204 since the hot aisle air is being pushed into the PSU from the exhaust side. Effects include elevated temperatures for all components, reduction in temperature margin, reduced reliability/life cycle and concern over warranty.

Figure 3:
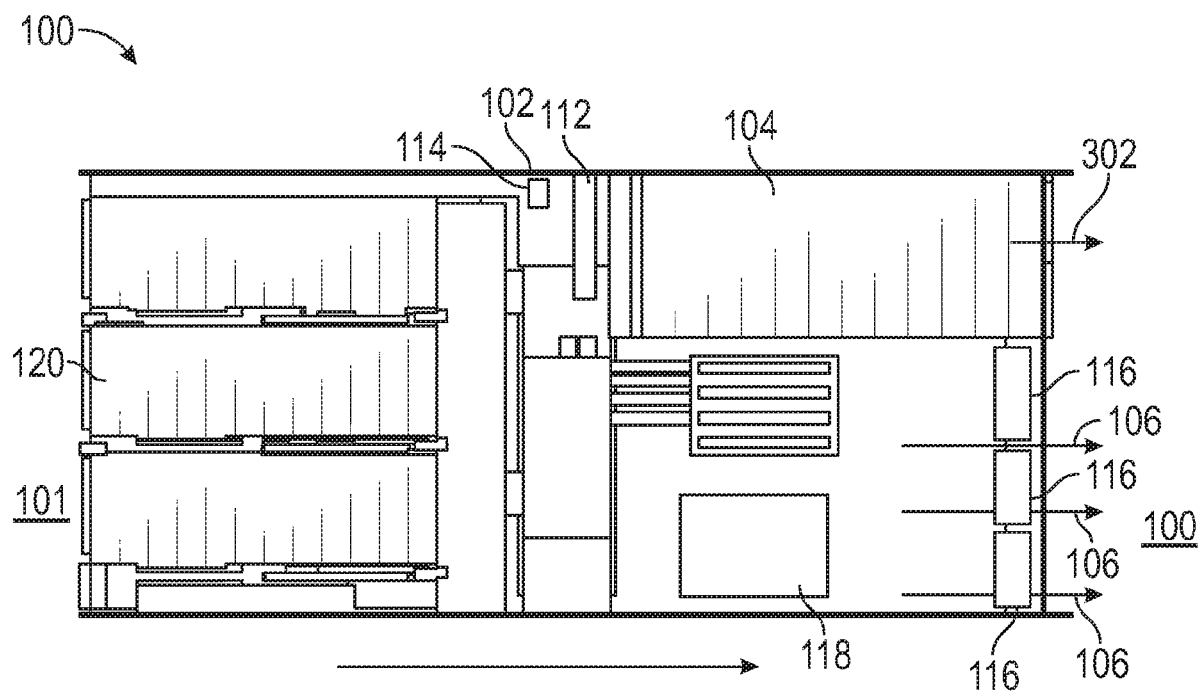
FIG. 3 is a schematic diagram illustrating the flow path of hot air being properly expelled from the PSU of FIG. 1 according to an embodiment.

FIG. 3 is a schematic diagram illustrating the flow path of exhaust air being properly expelled from the PSU of FIG. 1 according to an embodiment. In FIG. 3, PSU fan 112 of PSU 204 has been controlled, according to an embodiment of a method, to increase its speed with respect to the fan speed of system fans 116. As a result, reverse PSU airflow 108 has been eliminated, which provides the PSU with the proper PSU airflow direction 302, expelling its hot air into the hot aisle as intended.

Figure 4:
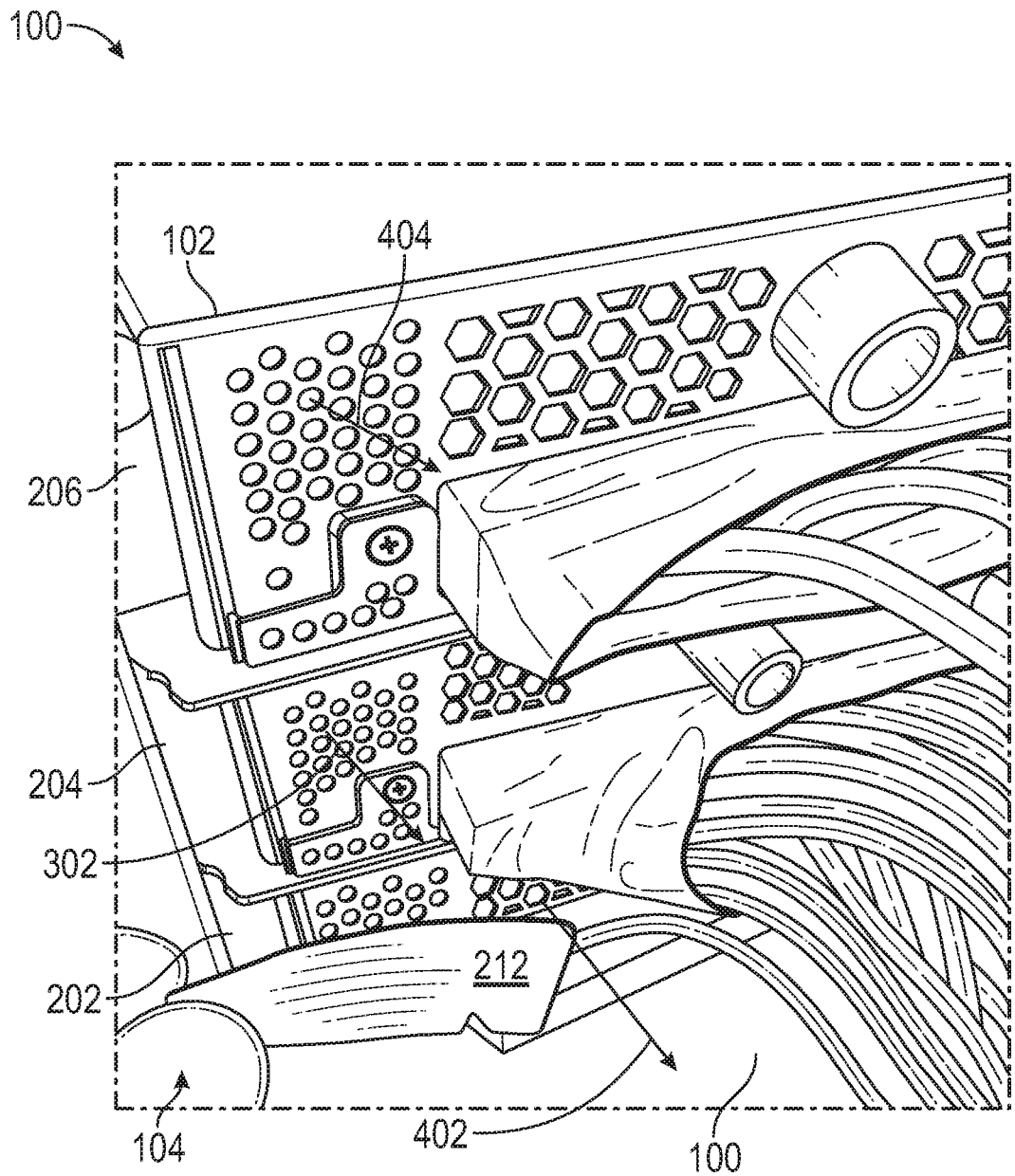
FIG. 4 is an image showing hot air being properly expelled from the PSU of FIG. 2 according to an embodiment.

FIG. 4 is an image showing exhaust air being properly expelled from the PSUs of FIG. 2 according to an embodiment. In FIG. 4, air being pushed out from PSUs 202, 204, and 206 – showing no air recirculation. Thus, in FIG. 4, air is being properly expelled from PSUs 202, 204, 206 of FIG. 2. PSUs 204 is shown to have exhaust airflow 302 previously described with respect to FIG. 3. PSUs 202, 206 are shown to have exhaust airflows 402, 404 respectively. In FIG. 4, telltale 212 is shown to bend away from PSU 204, indicating that exhaust flow 302 is properly exiting PSU 204.

In an embodiment, a correlation between a desired PSU fan speed and a system fan speed may be determined empirically as follows. First, for an initial system fan speed (e.g., a setting of 30% pulse-width modulation (PWM)) the PSU fan speed setting (e.g., PSU PWM) is manually increased, from an initial low PWM setting, until the PSU fan speed overcomes the reverse airflow. At the point the PSU fan speed overcomes the reverse airflow, the telltale will change, from indicating reverse flow into the PSU (e.g., telltale 212 as shown in FIG. 2), to indicating exhaust flow properly exiting the PSU (e.g., telltale 212 as shown in FIG. 4). The process may be repeated with incremental changes in system fan speeds from 30% to 100%. With each incremental change in system fan speeds, the PSU fan speed necessary to overcome the reverse PSU exhaust airflow is noted.

In the above embodiment of the process, both the system fan speed and the PSU fan speed may be set using their respective PWM settings (i.e., a fan pulse-width modulation (PWM) setting). However, in embodiments, different settings of fan speed may be used. For example, fan speeds may be set digitally, or by an applied voltage within a range of voltages.

With the data from the system fan speed settings and the resulting PSU fan speed settings needed to overcome reverse PSU exhaust airflow, a correlation may be developed that provides a PSU fan speed setting for a system fan speed. By setting PSU fan speeds according to this correlation, reverse PSU airflows may be avoided for all operating conditions.

For example, the data may be curve fit to the following equation (1):

$$Y = a*X^2 + b*X + c, \qquad \text{Equation (1)}$$

Where: X= system fan PWM, Y=PSU fan PWM, and a, b, and c are constants

In embodiments, the correlation between the system fan speed and the PSU fans speed may be described using other curve-fitting techniques. For example, data regarding system fan settings and speeds and the resulting system airflows, PSU fan settings and speeds and the resulting PSU airflows, server internal geometry, and PSU internal geometry, could be combined with computational fluid dynamics to model the server exhaust airflow and derive a correlation between PSU fan speed and system fan speed that prevents reverse PSU flow.

A primary benefit of the various embodiments is that the recirculation of PSU airflow may be avoided for all operating conditions. An additional benefit is that control of the PSU fan speed according to the correlation may prevent a hardware change.

As stated, FPGA cards 120 are exemplary of heat-creating devices within server 120. Similarly, server 120 is exemplary of a computing device that includes two separate heat-producing systems where the exhaust from one system may at times overpower the exhaust from the second system and cause an undesired, reversed airflow. Thus, embodiments of the methods within may be applied to other systems with recirculation concerns.

In an embodiment, control of the PSU fan speed according to the determined correlation between PSU fan speed and system fan speed may be incorporated into the system fan FSC (e.g., using BMC FW), without interfering with the native PSU FSC. That is, native PSU FSC may still be active, with the PSU configured to compare the PWM setting from the PSU FSC to the PWM setting determined by the correlation and select the higher of the two PWM settings. This is allowed through control of PSU Fan PWM override registers in the PSU microcontroller. These registers are accessed over the PMBus, which is a 2-wire communication interface connected between the BMC and PSU. For example, an overall PSU controller may receive both the PSU FSC PWM setting and the PWM setting determined by the correlation and select the higher of the two PWM settings. The overall PSU controller may then control the PSU fans according to the selected higher PWM setting.

Figure 5:
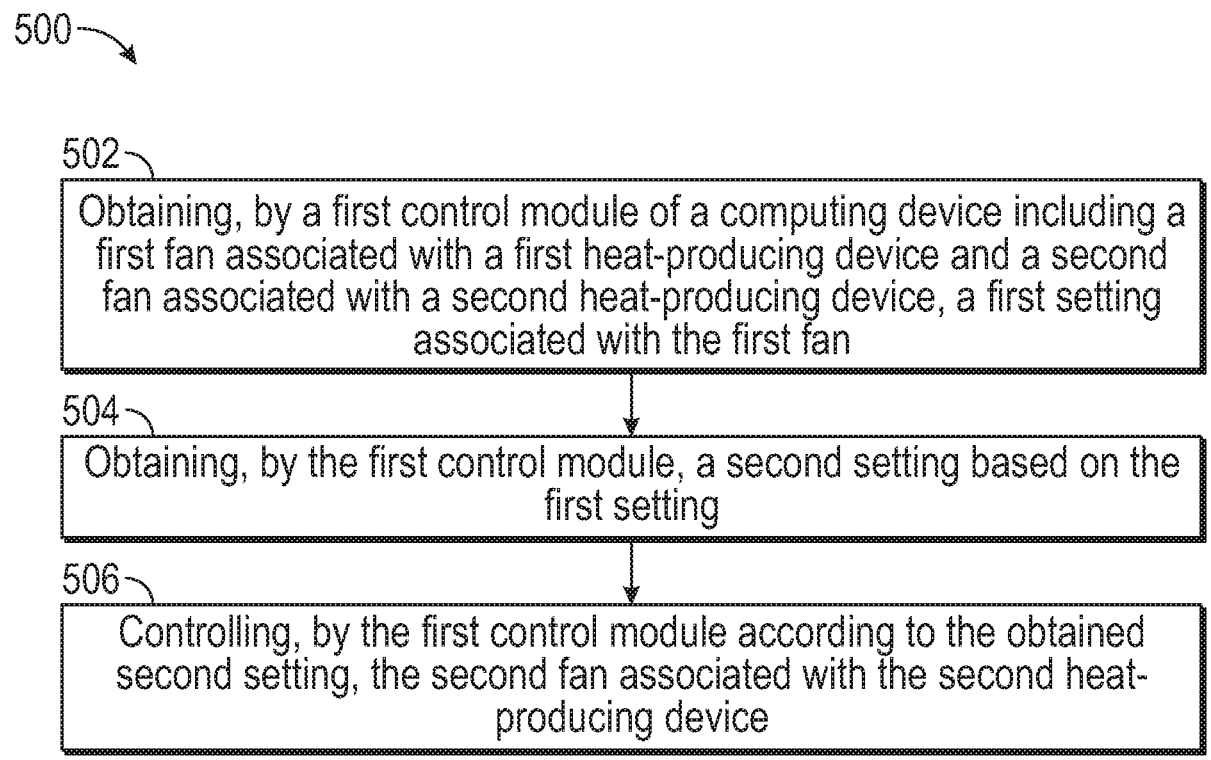
FIG. 5 is a flow chart of a method according to an embodiment.

FIG. 5 is a flow chart of a method 500 according to an embodiment. In method 500, in step 502, a first control module of a computing device including a first fan associated with a first heat-producing device and a second fan associated with a second heat-producing device, obtains a first setting associated with the first fan. In step 504, the first control module obtains a second setting based on the first setting. And in step 506, the first control module controls the second fan according to the obtained second setting. In an embodiment, the second setting is obtained by the first control module using the first setting and determining the second setting from a correlation that relates the setting of the second fan to the setting of the first fan. In an embodiment, the correlation that relates the setting of the second fan to the setting of the first fan is determined by: determining, for each of a first plurality of first settings, a corresponding second setting that prevents a reverse flow of exhaust through the second heat-producing device to obtain a second plurality of second settings; and correlating the second plurality of second settings with the first plurality of first settings.

Figure 6:
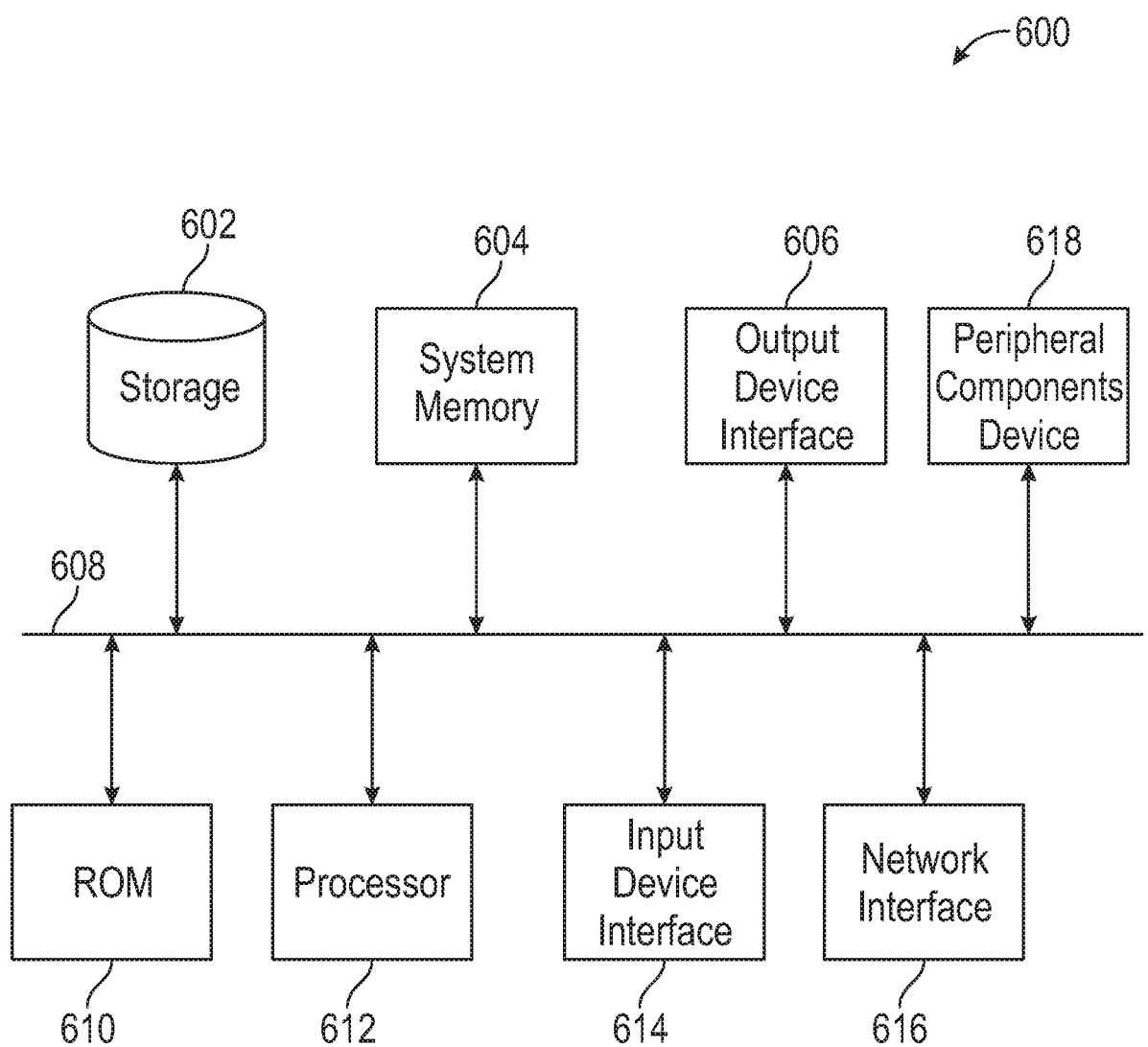
FIG. 6 conceptually illustrates an example electronic system with which some implementations of the subject technology may be implemented.

FIG. 6 conceptually illustrates an example electronic system 600 with which some implementations of the subject technology may be implemented. Electronic system 600 can be a computer, a server or any other sort of electronic device that includes components that have heat generation properties. Such an electronic system includes various types of computer readable media and interfaces for various other types of computer readable media. Electronic system 600 includes a bus 608, processing unit(s) 612, a system memory 604, a read-only memory (ROM) 610, a permanent storage device 602, an input device interface 614, an output device interface 606, a network interface 616 and peripheral component device(s) 618.

Bus 608 collectively represents all system, peripheral, and chipset buses that communicatively connect the numerous internal devices of electronic system 600. For instance, bus 608 communicatively connects processing unit(s) 612 with ROM 610, system memory 604, permanent storage device 602 and peripheral component device(s) 618. In an embodiment, processing unit(s) 612 may be the central processing unit (CPU), and system memory 604 may be a dual in-line memory module (DIMM). Furthermore, peripheral component device(s) 618 may be connected to bus 608 via a peripheral component interconnect express (PCIe) card (not shown).

From these various memory units, processing unit(s) 612 retrieves instructions to execute the processes of the subject disclosure (i.e., control of the component cooling system). The processing unit(s) can be a single processor or a multi-core processor in different implementations.

ROM 610 stores static data and instructions that are needed by processing unit(s) 612 and other modules of the electronic system. Permanent storage device 602, on the other hand, is a read-and-write memory device. This device is a non-volatile memory unit that stores instructions and data even when electronic system 600 is off. Some implementations of the subject disclosure use a mass-storage device (such as a magnetic, solid state, or optical disk and its corresponding disk drive) as permanent storage device 602.

Other implementations use a removable storage device (such as a floppy disk, flash drive, and its corresponding disk drive) as permanent storage device 602. Like permanent storage device 602, system memory 604 is a read-and-write memory device. However, unlike storage device 602, system memory 604 is a volatile read-and-write memory, such as random access memory. System memory 604 stores some of the instructions and data that the processor needs at runtime. In some implementations, the processes of the subject disclosure are stored in system memory 604, permanent storage device 602, and/or ROM 610. For example, the various memory units include instructions for determining an output of a computer component cooling system. From these various memory units, processing unit(s) 612 retrieves instructions to execute and data to process in order to execute the processes of some implementations.

Bus 608 also connects to input and output device interfaces 614 and 606. Input device interface 614 enables the user to communicate information and select commands to the electronic system. Input devices used with input device interface 614 include, for example, alphanumeric keyboards and pointing devices (also called "cursor control devices"). Output device interface 606 enables, for example, the display of images generated by the electronic system 600. Output devices used with output device interface 606 include, for example, printers and display devices, such as cathode ray tubes (CRT) or liquid crystal displays (LCD). Some implementations include devices such as a touchscreen that functions as both input and output devices.

Finally, as shown in FIG. 6, bus 608 also couples electronic system 600 to a network (not shown) through a network interface 616. In this manner, the computer can be a part of a network of computers, such as a local area network, a wide area network, or an Intranet, or a network of networks, such as the Internet. Any or all components of electronic system 600 can be used in conjunction with the subject disclosure.

It is understood that any specific order or hierarchy of steps in the processes disclosed is an illustration of approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. A method comprising:
    obtaining, by a first control module of a computing device including a first fan pulling a first airflow through a chassis associated with a first heat-producing device and a second fan associated with a second heat-producing device provided within the chassis and pushing a second airflow through the second heat-producing device, a first setting associated with the first fan;
    obtaining, by the first control module, a second setting based on the first setting;
    controlling, by the first control module according to the obtained second setting, the second fan associated with the second heat-producing device; and
    preventing, by the controlling according to the obtained second setting, a third airflow from exiting the second heat-producing device directly into an interior of the chassis between the first fan and the second fan.

2. The method of claim 1, wherein the first setting includes one of: a pulse-width modulation (PWM) value; a voltage signal, or a digital fan speed signal.

3. The method of claim 1, wherein the controlling, by the first control module according to the obtained second setting, the second fan includes:
    setting, by the first control module, a control signal associated with the second fan to the obtained second setting.

4. The method of claim 1, wherein the obtaining, by the first control module, a second setting based on the first setting includes:
    using, by the first control module, the obtained first setting to determine the second setting from a correlation that relates the setting of the second fan to the setting of the first fan.

5. The method of claim 4 further comprising determining the correlation that relates the setting of the second fan to the setting of the first fan by:
    determining, for each of a first plurality of first settings, a corresponding second setting that prevents the third airflow to obtain a second plurality of second settings; and
    correlating the second plurality of second settings with the first plurality of first settings.

6. The method of claim 1 further comprising:
    obtaining, by the first control module from a second control module associated with the second heat-producing device, a third setting associated with the second fan;
    comparing, by the first control module, the third setting to the second setting;
    determining, by the first control module based on the comparison, that the second setting is greater than the third setting; and
    as a result of the determination that the second setting is greater than the third setting, performing the controlling, by the first control module according to the obtained second setting, of the second fan associated with the second heat-producing device.

7. The method of claim 6, wherein the first control module is executed by a baseboard management controller (BMC), the second heat-producing device is a power supply unit (PSU), and the second control module is executed by a fan speed controller (FSC) of the PSU.

8. A non-transitory computer-readable storage medium having stored thereon a plurality of instructions which, when executed by a processor of a first control module of a computing device including a first fan pulling a first airflow through a chassis associated with a first heat-producing device and a second fan associated with a second heat-producing device provided within the chassis and pushing a second airflow through the second heat-producing device, cause the first control module to perform the steps of a method comprising:
    obtaining a first setting associated with the first fan;
    obtaining a second setting based on the first setting;
    controlling, according to the obtained second setting, the second fan associated with the second heat-producing device; and
    preventing, by the controlling according to the obtained second setting, a third airflow from exiting the second heat-producing device directly into an interior of the chassis between the first fan and the second fan.

9. The computer-readable storage medium of claim 8, wherein the first setting includes one of: a pulse-width modulation (PWM) value; a voltage signal, or a digital fan speed signal.

10. The computer-readable storage medium of claim 8, wherein the controlling, according to the obtained second setting, the second fan includes:
    setting a control signal associated with the second fan to the obtained second setting.

11. The computer-readable storage medium of claim 8, wherein the obtaining a second setting based on the first setting includes:
    using the obtained first setting to determine the second setting from a correlation that relates the setting of the second fan to the setting of the first fan.

12. The computer-readable storage medium of claim 11, the steps of the method further comprising determining the correlation that relates the setting of the second fan to the setting of the first fan by:
    determining, for each of a first plurality of first settings, a corresponding second setting that prevents the third airflow to obtain a second plurality of second settings; and
    correlating the second plurality of second settings with the first plurality of first settings.

13. The computer-readable storage medium of claim 8, the steps of the method further comprising:
    obtaining, from a second control module associated with the second device, a third setting associated with the second fan;
    comparing the third setting to the second setting;
    determining, based on the comparison, that the second setting is greater than the third setting; and
    as a result of the determination that the second setting is greater than the third setting, performing the controlling, according to the obtained second setting, of the second fan associated with the second device.

14. The computer-readable storage medium of claim 13, wherein the first control module is executed by a baseboard management controller (BMC), the second device is a power supply unit (PSU), and the second control module is executed by a fan speed controller (FSC) of the PSU.

15. A system including a computing device with a first control module, a first fan pulling a first airflow through a chassis associated with a first heat-producing device, a second fan associated with a second heat-producing device provided within the chassis and pushing a second airflow through the second heat-producing device, and memory with instructions which when executed by a processor of the first control module, cause the first control module to perform the steps of a method comprising:
    obtaining a first setting associated with the first fan;
    obtaining a second setting based on the first setting;
    controlling, according to the obtained second setting, the second fan associated with the second heat-producing device; and
    preventing, by the controlling according to the obtained second setting, a third airflow from exiting the second heat-producing device directly into an interior of the chassis between the first fan and the second fan.

16. The system of claim 15, wherein the first setting includes one of: a pulse-width modulation (PWM) value; a voltage signal, or a digital fan speed signal.

17. The system of claim 15, wherein the controlling, according to the obtained second setting, the second fan includes:
    setting a control signal associated with the second fan to the obtained second setting.

18. The system of claim 15, wherein the obtaining a second setting based on the first setting includes:
    using the obtained first setting to determine the second setting from a correlation that relates the setting of the second fan to the setting of the first fan.

19. The system of claim 18, the steps of the method further comprising determining the correlation that relates the setting of the second fan to the setting of the first fan by:
    determining, for each of a first plurality of first settings, a corresponding second setting that prevents the third airflow to obtain a second plurality of second settings; and
    correlating the second plurality of second settings with the first plurality of first settings.

20. The system of claim 15, the steps of the method further comprising:
    obtaining, from a second control module associated with the second device, a third setting associated with the second fan;
    comparing the third setting to the second setting;
    determining, based on the comparison, that the second setting is greater than the third setting; and
    as a result of the determination that the second setting is greater than the third setting, performing the controlling, according to the obtained second setting, of the second fan associated with the second device.

* * * * *